(12) United States Patent
Shen et al.

(10) Patent No.: US 10,818,498 B1
(45) Date of Patent: Oct. 27, 2020

(54) SHAPED GATE CAPS IN SPACER-LINED OPENINGS

(71) Applicant: GLOBALFOUNDRIES Inc., Grand Cayman (KY)

(72) Inventors: Yanping Shen, Saratoga Springs, NY (US); Haiting Wang, Clifton Park, NY (US); Hui Zang, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/407,744

(22) Filed: May 9, 2019

(51) Int. Cl.
| | |
|---|---|
| *H01L 29/66* | (2006.01) |
| *H01L 21/28* | (2006.01) |
| *H01L 29/78* | (2006.01) |
| *H01L 29/40* | (2006.01) |
| *H01L 21/02* | (2006.01) |
| *H01L 29/417* | (2006.01) |
| *H01L 21/768* | (2006.01) |

(52) U.S. Cl.
CPC .. *H01L 21/28247* (2013.01); *H01L 21/02109* (2013.01); *H01L 21/76829* (2013.01); *H01L 29/401* (2013.01); *H01L 29/41791* (2013.01); *H01L 29/6653* (2013.01); *H01L 29/6656* (2013.01); *H01L 29/785* (2013.01)

(58) Field of Classification Search
CPC .......... H01L 29/6656; H01L 29/41791; H01L 29/785
See application file for complete search history.

(56) References Cited

U.S. PATENT DOCUMENTS

| | | | |
|---|---|---|---|
| 6,177,320 B1 | 1/2001 | Cho et al. | |
| 7,670,942 B2 | 3/2010 | Kim et al. | |
| 9,129,986 B2 | 9/2015 | Zang et al. | |
| 2018/0315822 A1* | 11/2018 | Xie | H01L 21/76834 |
| 2020/0126979 A1* | 4/2020 | Ching | H01L 21/823437 |

* cited by examiner

*Primary Examiner* — Selim U Ahmed
*Assistant Examiner* — Evan G Clinton
(74) *Attorney, Agent, or Firm* — Thompson Hine LLP; Francois Pagette

(57) ABSTRACT

Structures for a field effect-transistor and methods of forming a structure for a field-effect transistor. A gate electrode arranged adjacent to an outer sidewall spacer and an inner sidewall spacer. The gate electrode has a top surface that is recessed relative to the outer sidewall spacer and the inner sidewall spacer. A gate cap includes a first section of a first width arranged over the first section of the gate electrode and a second section of a second width arranged over the first section of the gate cap and the inner sidewall spacer. The second width is greater than the first width, and the inner sidewall spacer is composed of a low-k dielectric material.

19 Claims, 9 Drawing Sheets

SHAPED GATE CAPS IN SPACER-LINED OPENINGS

BACKGROUND

The present invention relates to semiconductor device fabrication and integrated circuits and, more specifically, to structures for a field effect-transistor and methods of forming a structure for a field-effect transistor.

Contacts may provide vertical electrical connections extending to features of a field-effect transistor, such as a gate electrode and the source/drain regions flanking the gate electrode. A gate cap may be formed in a space over a gate electrode by recessing the gate electrode, depositing a dielectric material in the recess, and polishing the deposited dielectric material with a chemical-mechanical polishing process. An interlayer dielectric layer is formed that includes sections arranged over the source/drain regions. Sidewall spacers are arranged between the gate electrode and the source/drain regions.

The sections of the interlayer dielectric layer are removed selective to the gate cap and sidewall spacers in order to define openings in which source/drain contacts are formed. The removal of these sections of the interlayer dielectric layer can potentially open pathways that are filled with metal during the formation of the source/drain contacts. The metal-filled pathways can lead to shorting between the gate electrode and one or both of the source/drain contacts.

A gate contact is formed in a contact opening that is defined by removing a section of the gate cap with an etching process. During the formation of the gate contact, the removal of the section of the gate cap exposes an underlying section of the gate electrode. Due to poor etch selectivity between the dielectric material of the gate cap and the dielectric material of the sidewall spacers, the removal of the gate cap may result in unwanted pull-down of the sidewall spacers. The pull-down of the sidewall spacers may lead to shorting between the gate contact and source/drain regions or shorting between the gate contact and the source/drain contacts.

Improved structures for a field effect-transistor and methods of forming a structure for a field-effect transistor are needed.

SUMMARY

In an embodiment of the invention, a structure includes an outer sidewall spacer, an inner sidewall spacer, and a gate electrode arranged adjacent to the outer sidewall spacer and the inner sidewall spacer. The gate electrode has a top surface that is recessed relative to the outer sidewall spacer and the inner sidewall spacer. The structure further includes a gate cap having a first section of a first width arranged over the first section of the gate electrode and a second section of a second width arranged over the first section of the gate cap and the inner sidewall spacer. The second width is greater than the first width, and the inner sidewall spacer is composed of a low-k dielectric material.

In an embodiment of the invention, a method includes forming a gate electrode arranged between first and second outer sidewall spacers, and recessing a conformal liner of the gate electrode and a metal fill layer of the gate electrode relative to the first outer sidewall spacer and the second outer sidewall spacer with a first etching process to define a first cavity. The method further includes recessing the conformal liner of the gate electrode relative to the metal fill layer of the gate electrode with a second etching process to define a second cavity between the gate electrode and the first outer sidewall spacer, and forming an inner sidewall spacer having a first portion inside the first cavity and a second portion arranged in the second cavity over a top surface of the gate electrode. After forming the inner sidewall spacer, a gate cap is formed in the second cavity.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
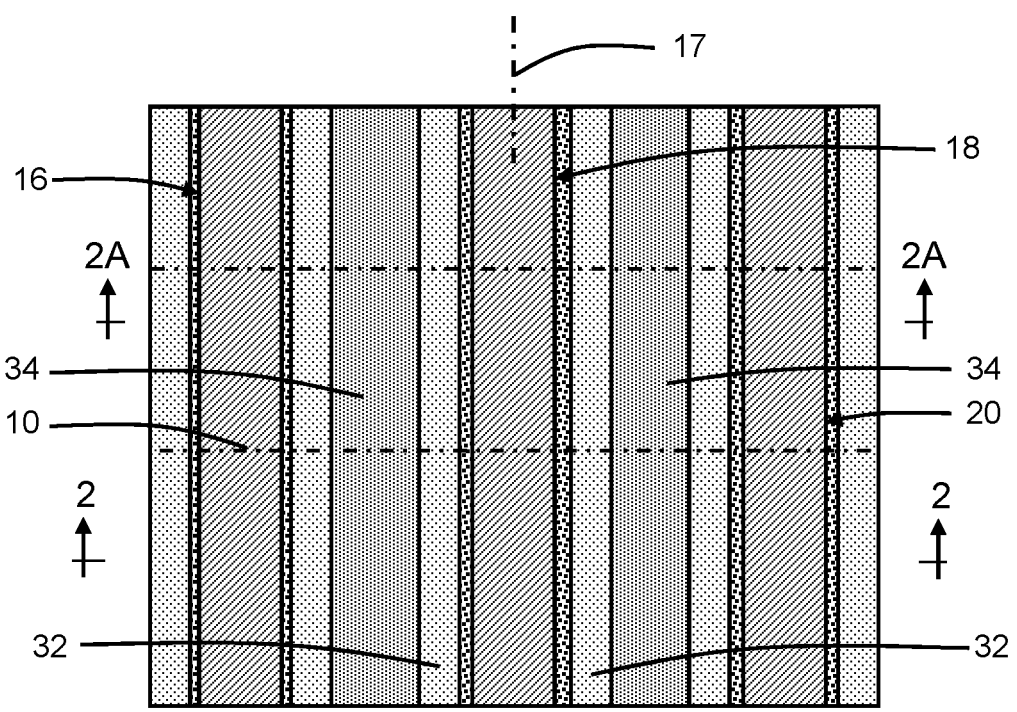
FIG. 1 is a top view of a structure at an initial fabrication stage of a processing method in accordance with embodiments of the invention.
Figure 2:
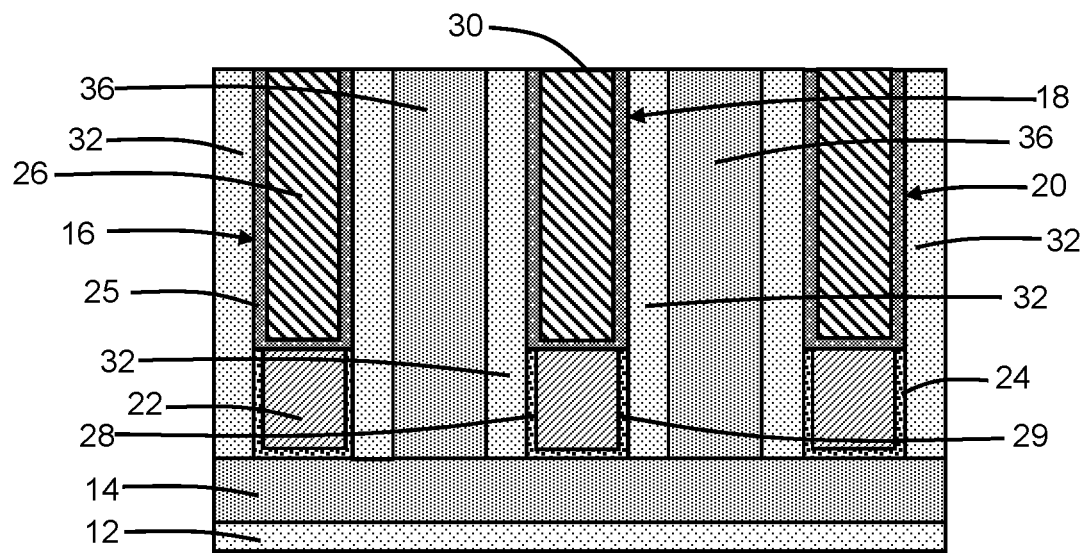
FIG. 2 is a cross-sectional view taken generally along line 2-2 in FIG. 1.
Figure 2A:
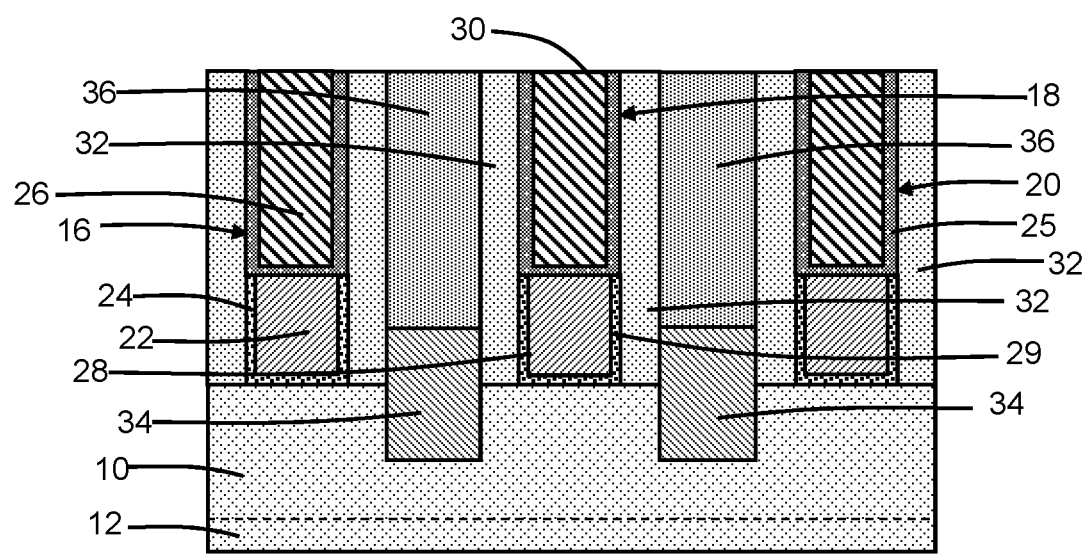
FIG. 2A is a cross-sectional view taken generally along line 2A-2A in FIG. 1.

With reference to FIGS. 1, 2, 2A and in accordance with embodiments of the invention, a fin 10 is formed that projects upwardly from a top surface of a substrate 12. The fin 10 may be formed by patterning the single-crystal semiconductor material (e.g., single-crystal silicon) of the substrate 12 with lithography and etching processes. A trench isolation region 14 may be formed that surrounds a lower portion of the fin 10. An upper portion of the fin 10 is arranged above a top surface of the trench isolation region 14. The trench isolation region 14 may be formed by depositing a layer composed of a dielectric material, such as silicon dioxide, and recessing the deposited layer with an etching process to expose an upper portion of the fin 10.

Gate electrodes 16, 18, 20 are formed that extend in part over the fin 10 and in part over the trench isolation region 14. The gate electrode 18 is aligned along a longitudinal axis 17, and the other gate electrodes 16 and 20 are similarly aligned along respective longitudinal axes that may be arranged substantially parallel to the longitudinal axis 17.

Each of the gate electrodes 16, 18, 20 includes one or more work function metal layers 22, such as layers composed of titanium aluminum carbide and/or titanium nitride, that are characteristic of either the gate of a p-type field-effect transistor or the gate of an n-type field-effect transistor. A gate dielectric layer 24 composed of a dielectric material, such as a high-k dielectric material like hafnium oxide, is arranged as a liner about the one or more work function metal layers 22 of each of the gate electrodes 16, 18, 20. A portion of the gate dielectric layer 24 is arranged between the fin 10 and the one or more work function metal layers 22 of each of the gate electrodes 16, 18, 20.

Each of the gate electrodes 16, 18, 20 further includes a metal fill layer 26 arranged over the one or more work function metal layers 22 and a liner 25 arranged about the metal fill layer 26. The metal fill layer 26 may be composed of a low-resistance conductor, such as tungsten or cobalt, and the liner 25 may be composed of a conductor, such as titanium nitride. A portion of the liner 25 may be arranged between the one or more work function metal layers 22 and the metal fill layer 26.

Each of the gate electrodes 16, 18, 20 includes a side surface or sidewall 28 and a side surface or sidewall 29 that is opposite from the sidewall 28, as well as a top surface 30 that extends from the sidewall 28 to the sidewall 29. The sidewalls 28, 29 are covered by sections of the liner 25 and portions of the gate dielectric layer 24. Sidewall spacers 32 are arranged adjacent to the opposite sidewalls 28, 29 of the gate electrodes 16, 18, 20. The gate electrodes 16, 18, 20 may be formed by a replacement metal gate process that involves the removal of dummy gates originally between the sidewall spacers 32. The sidewall spacers 32 may be composed of a low-k dielectric material, such as SiOCN or SiOC, that is deposited using the dummy gates as mandrels and then etched with an anisotropic etching process, such as reactive ion etching.

Semiconductor layers 34 are grown from the fin 10 with an epitaxial growth process. In an embodiment, the semiconductor layers 34 may contain silicon-germanium doped during epitaxial growth with a p-type dopant (e.g., boron, aluminum, gallium, and/or indium) that provides p-type electrical conductivity. In an embodiment, the semiconductor layers 34 may contain silicon doped during epitaxial growth with an n-type dopant (e.g., phosphorus and/or arsenic) that provides n-type electrical conductivity. Portions of the semiconductor layers 34 are arranged in cavities defined in the fin 10 between the gate electrodes 16, 18, 20. The semiconductor layers 34 furnish source/drain regions for one or more field-effect transistors formed using the fin 10. As used herein, the term "source/drain region" means a doped region of semiconductor material that can function as either a source or a drain of a field-effect transistor.

Sections of an interlayer dielectric layer 36 are disposed in spaces over the epitaxial semiconductor layers 34. In particular, a section of the interlayer dielectric layer 36 is arranged adjacent to the sidewall spacer 32 at the sidewall 28 of the gate electrode 18, and another section of the interlayer dielectric layer 36 is arranged adjacent to the sidewall spacer 32 at the opposite sidewall 29 of the gate electrode 18. The interlayer dielectric layer 36 may be composed of a dielectric material, such as silicon dioxide, that is deposited and planarized, and that differs in composition from the dielectric material of the sidewall spacers 32.

Figure 3:
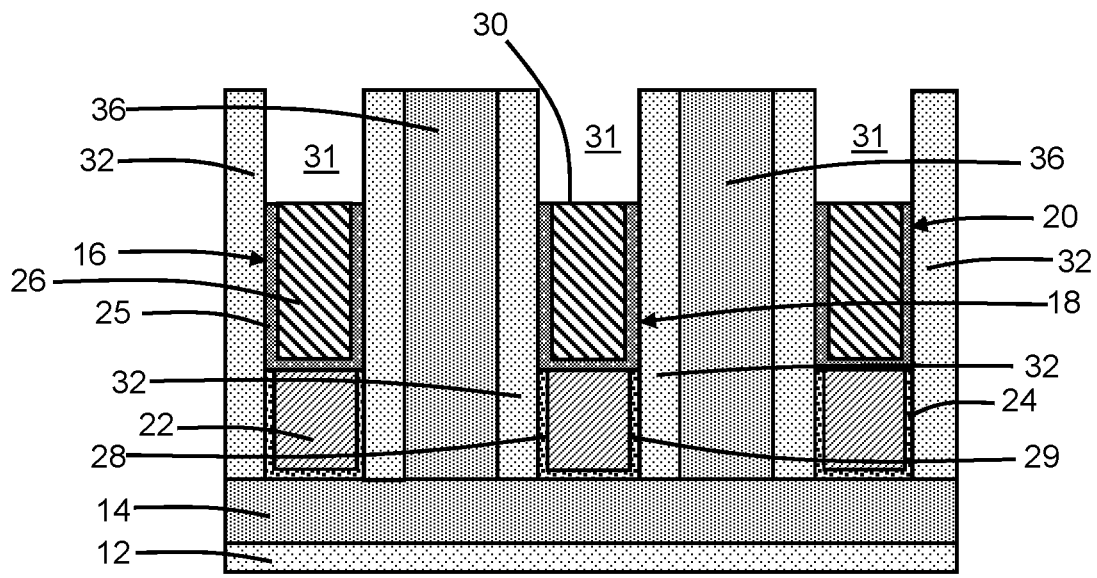
FIGS. 3-9 and 3A-9A are cross-sectional views of the structure at successive fabrication stages of the processing method respectively subsequent to FIGS. 2 and 2A.
Figure 3A:
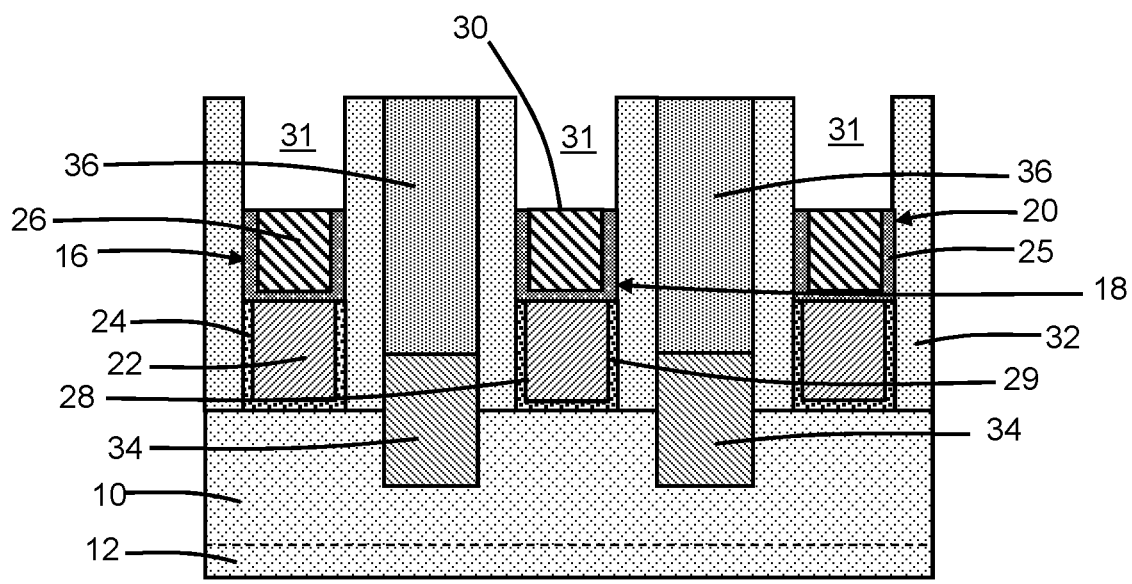

With reference to FIGS. 3 and 3A in which like reference numerals refer to like features in FIGS. 2 and 2A and at a subsequent fabrication stage of the processing method, the metal fill layer 26 and liner 25 of each of the gate electrodes 16, 18, 20 are recessed and pulled down relative to the sidewall spacers 32 and the sections of the interlayer dielectric layer 36 with an etching process. In an embodiment, the metal fill layer 26 and liner 25 may be concurrently recessed by the etching process, and may be recessed by nominally the same amount. The etching process may include, for example, a wet chemical etching process that removes the materials of the metal fill layer 26 and liner 25 selective to the materials of the sidewall spacers 32 and the interlayer dielectric layer 36. Exemplary chemistries for the etching process include, but are not limited to, boron trichloride ($BCl_3$) or hydrochloric acid (HCl). As used herein, the terms "selective" and "selectivity" in reference to a material removal process (e.g., etching) denotes that, with an appropriate etchant choice, the material removal rate (i.e., etch rate) for the targeted material is greater than the removal rate for at least another material exposed to the material removal process. The etching process is self-aligned during its performance due at least in part to the etch selectivity.

The partial removal of the metal fill layer 26 and liner 25 forms a cavity 31 arranged between the sidewall spacers 32 adjacent to each of the gate electrodes 16, 18, 20. Each cavity 31 is arranged over the top surface 30 of the recessed metal fill layer 26 and liner 25 of one of the gate electrodes 16, 18, 20. Portions of the sidewall spacers 32 project or extend above the top surface 30 of the gate electrodes 16, 18, 20.

Figure 4:
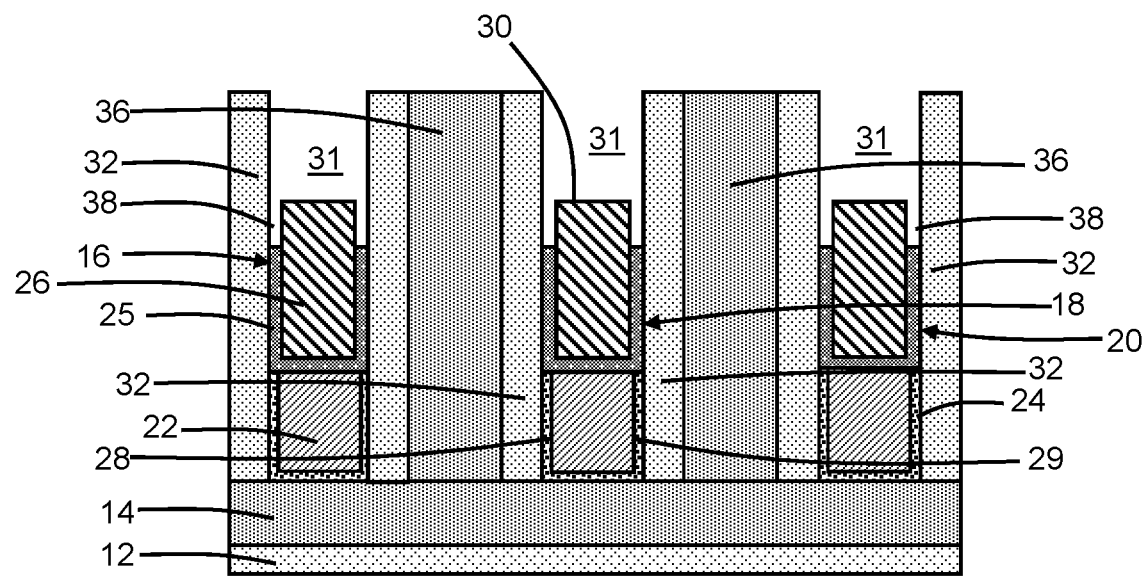
Figure 4A:
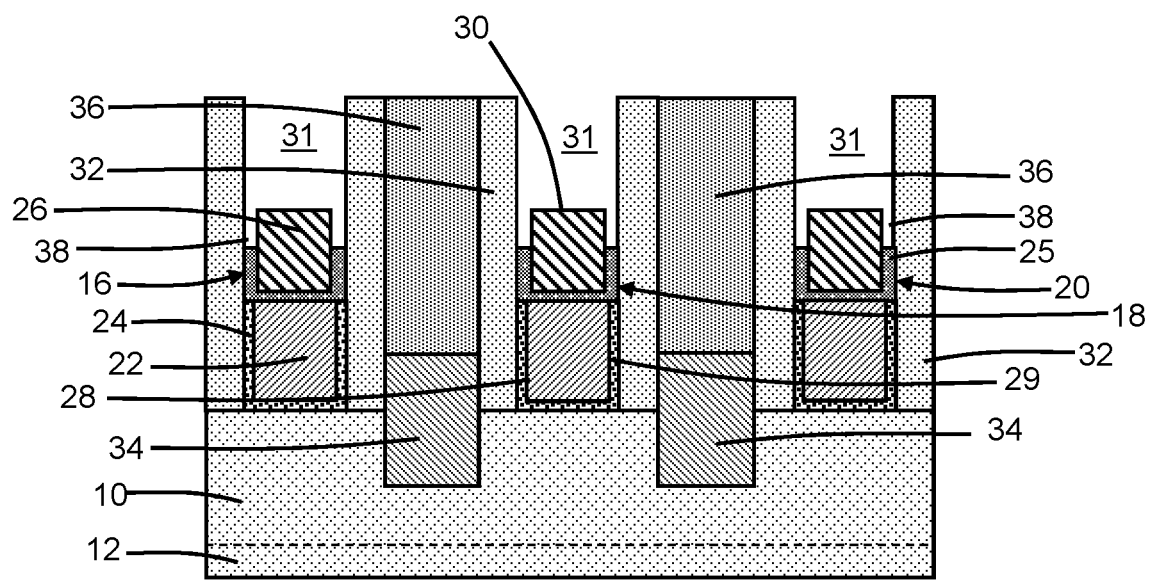

With reference to FIGS. 4 and 4A in which like reference numerals refer to like features in FIGS. 3 and 3A and at a subsequent fabrication stage of the processing method, the liner 25 of each of the gate electrodes 16, 18, 20 is recessed relative to the metal fill layer 26 using an etching process. The etching process may include, for example, a wet chemical etching process that removes the material of the liner 25 selective to the materials of the metal fill layer 26, sidewall spacers 32, and interlayer dielectric layer 36. Exemplary chemistries for the etching process include, but are not limited to, a wet SC1 clean (i.e., a mixture of water ($H_2O$), hydrogen peroxide ($H_2O_2$), and ammonium hydroxide ($NH_4OH$)) or hydrogen peroxide ($H_2O_2$). The etching process is self-aligned during its performance due at least in part to the etch selectivity. Shallow cavities 38 are formed laterally between the metal fill layer 26 and the sidewall spacers 32. The cavities 38 are in communication with the respective cavity 31, and the cavities 38 may be considered to merge with the respective cavity 31. The cavities 38 locally extend the depth of the cavities 31 below the top surface 30 of the gate electrodes 16, 18, 20 at locations adjacent to the sidewall spacers 32.

Figure 5:
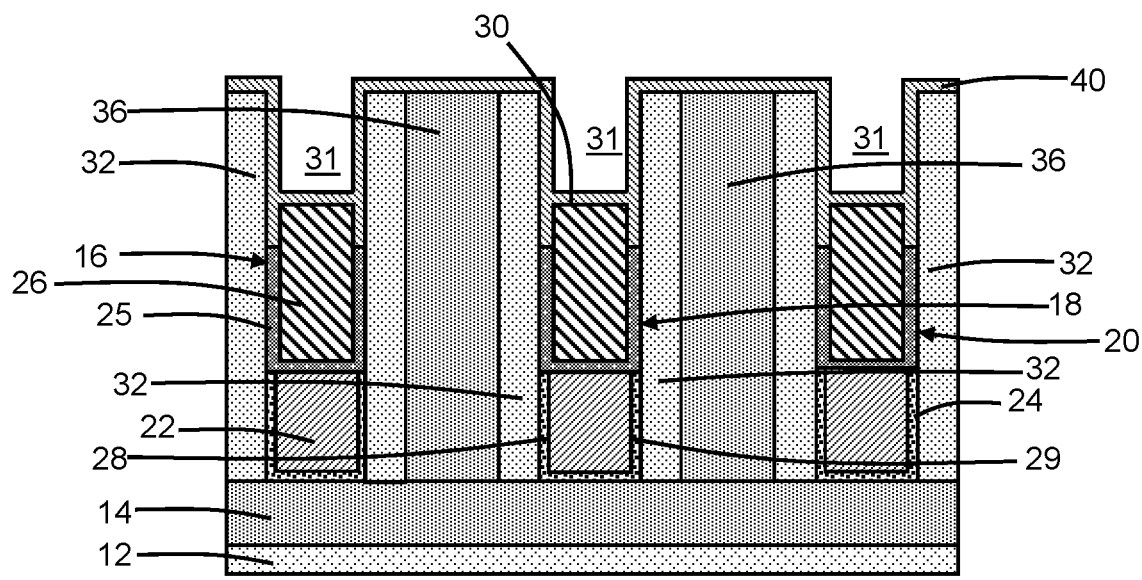
Figure 5A:
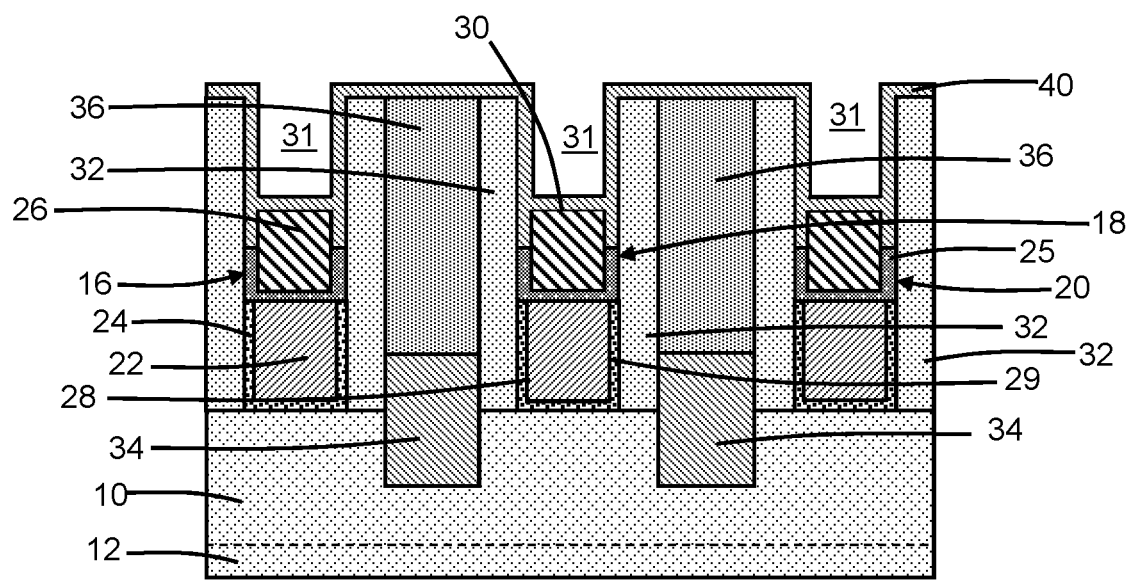

With reference to FIGS. 5 and 5A in which like reference numerals refer to like features in FIGS. 4 and 4A and at a subsequent fabrication stage of the processing method, a dielectric liner 40 is applied that conformally coats the multi-level contour of the surfaces inside the cavities 31 over the gate electrodes 16, 18, 20, the sections of the interlayer dielectric layer 36, and the sidewall spacers 32. The dielectric liner 40 covers the uneven topography and, in particular, includes sections that are arranged over the sections of the interlayer dielectric layer 36 and sections that pinch-off inside the cavities 38. In an embodiment, the dielectric liner 40 may have sections of approximately equal thickness that are arranged inside each cavity 31 and over the sections of the interlayer dielectric layer 36. The dielectric liner 40 may be composed of a low-k dielectric material, such as SiOCN or SiOC (carbon-doped silicon dioxide), that is deposited by atomic layer deposition. The low-k dielectric material has a permittivity (i.e., dielectric constant) that is less than the permittivity of silicon dioxide (e.g., 3.9). The dielectric material of the dielectric liner 40 may be selected to be removable with an etching process selective to the dielectric material of the sidewall spacers 32.

Figure 6:
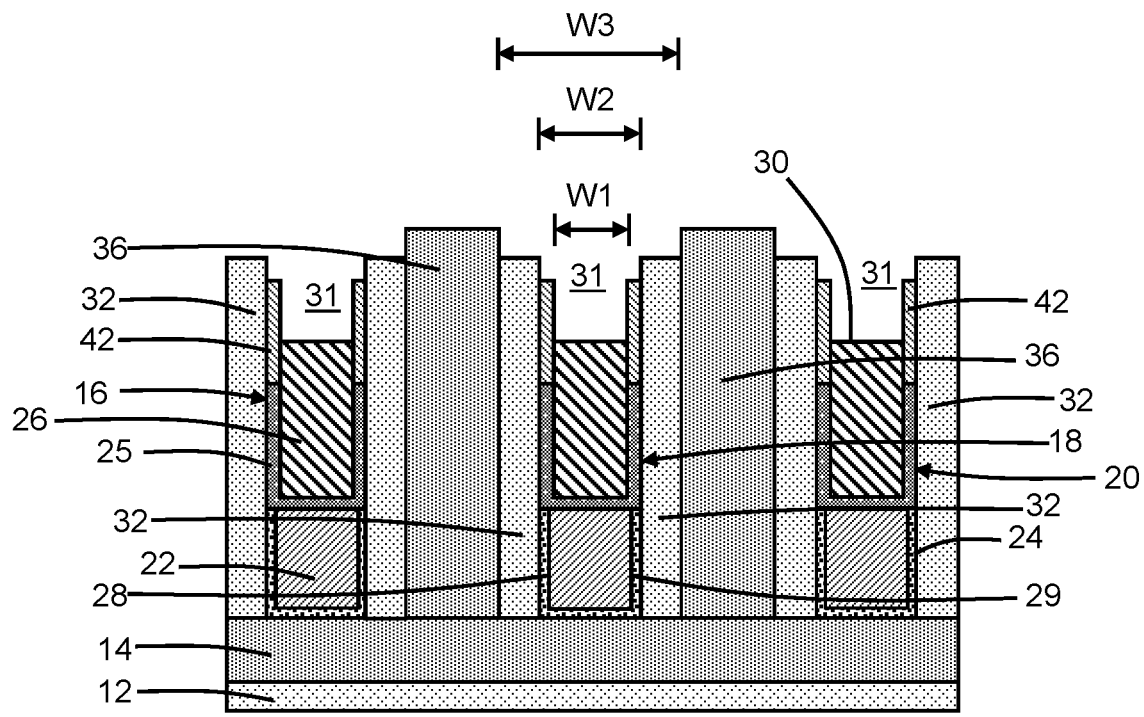
Figure 6A:
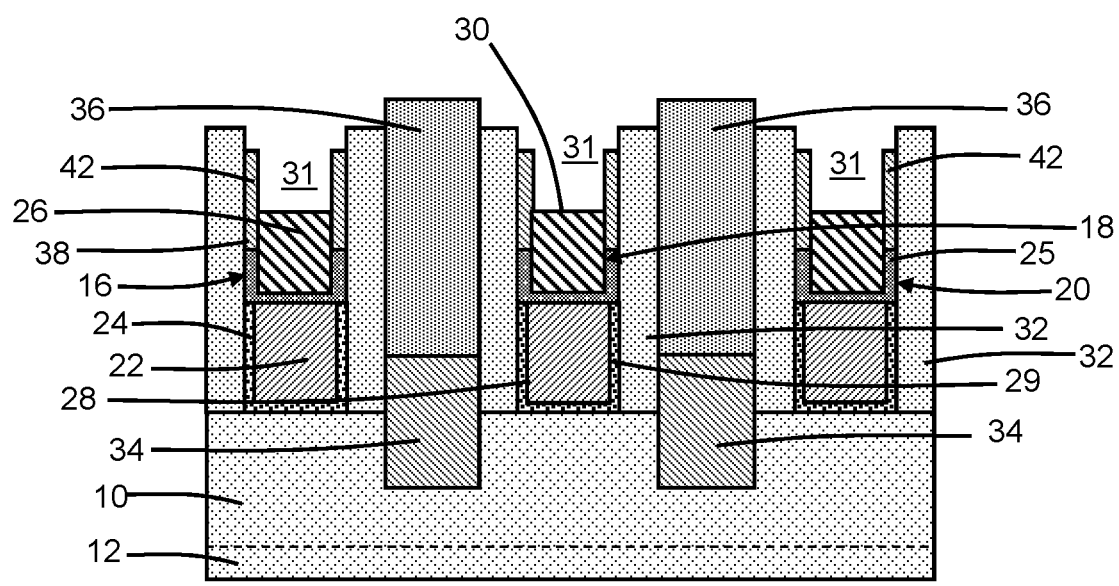

With reference to FIGS. 6 and 6A in which like reference numerals refer to like features in FIGS. 5 and 5A and at a subsequent fabrication stage of the processing method, sidewall spacers 42 are formed from the dielectric liner 40 (FIGS. 5, 5A) using an etching process. The etching process may also concurrently reduce the height of the sidewall spacers 32 relative to the sections of the interlayer dielectric layer 36. The difference in heights of the sidewall spacers 32 and the sidewall spacers 42 may be due, at least in part, to differences in etch rate during the etching process. Exemplary chemistries for the etching process include, but are not limited to, dilute hydrofluoric acid or a SC1 wet clean. The recessing of the sidewall spacers 32 exposes respective portions of the sections of the interlayer dielectric layer 36 at the top of each cavity 31.

The cavities 31 are modified by the etching process to have multiple widths and, in particular, a trio of widths. A lower section of each modified cavity 31 is arranged adjacent to, and coextensive with, the top surface 30 of each gate electrode 16, 18, 20. The lower section of each modified cavity 31 has a width dimension, W1, that may be substantially equal to the width dimension of the metal fill layer 26. The lower section of each modified cavity 31 is arranged laterally between the nearest-neighbor sidewall spacers 42, and extends from one of the sidewall spacers 42 to the other of the sidewall spacers 42. A middle section of each modified cavity 31 is arranged over one of the lower sections. The middle section of each modified cavity 31 has a width dimension, W2, that may be substantially equal to the distance between the nearest-neighbor sidewall spacers 32, and extends from one of the sidewall spacers 32 to the other of the sidewall spacers 32. An upper section of each modified cavity 31 is arranged over one of the middle sections. The upper section of each modified cavity 31 has a width dimension, W3, that may be substantially equal to the distance between adjacent sections of the interlayer dielectric layer 36, and extends from one of the sections of the interlayer dielectric layer 36 to the other of the sections of the interlayer dielectric layer 36.

Figure 7:
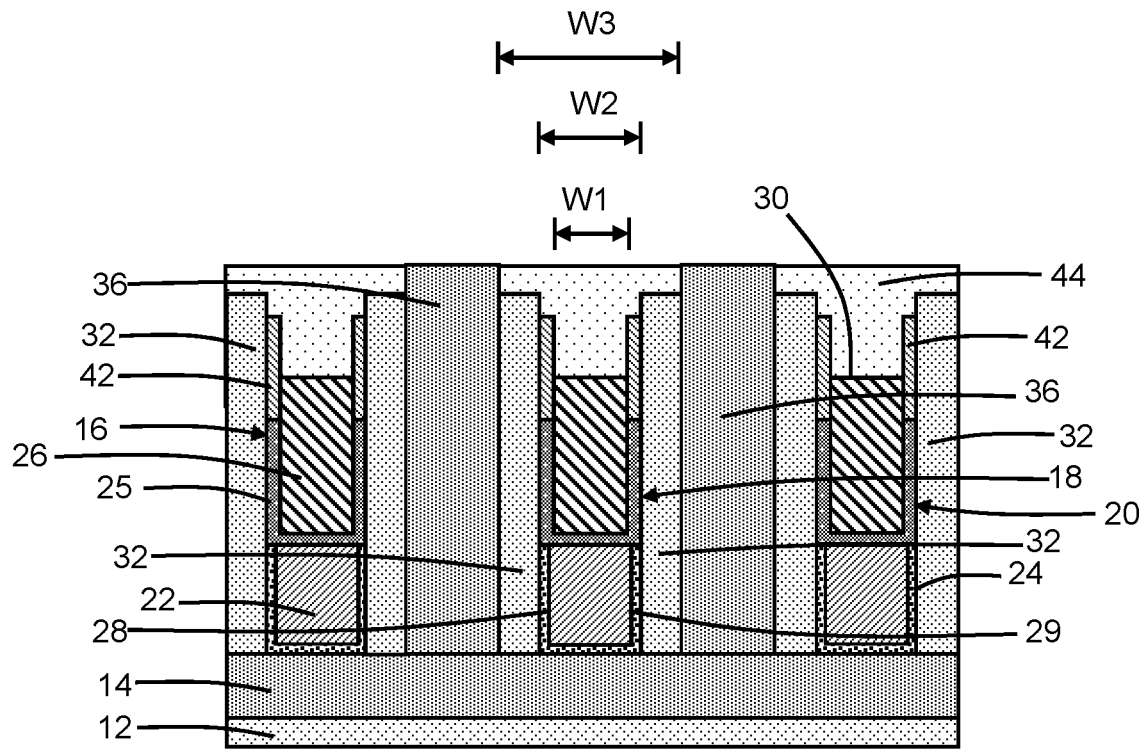
Figure 7A:
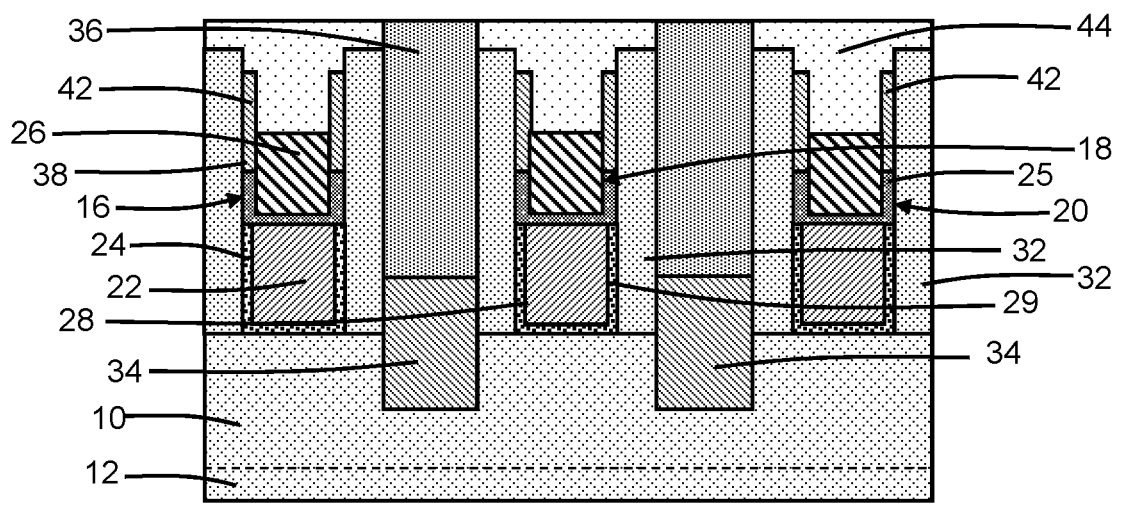

With reference to FIGS. 7 and 7A in which like reference numerals refer to like features in FIGS. 6 and 6A and at a subsequent fabrication stage of the processing method, self-aligned contact caps 44 are formed as gate caps (i.e., dielectric caps) in the multiple-width cavities 31 over the gate electrodes 16, 18, 20. The self-aligned contact caps 44 may be composed of a dielectric material that is deposited by chemical vapor deposition and then planarized with chemical-mechanical polishing. The deposited dielectric material may fully fill each of the cavities 31. The dielectric material of the self-aligned contact caps 44 has a permittivity (i.e., dielectric constant) greater than the permittivity of silicon dioxide (e.g., 3.9) and, in an embodiment, the dielectric material may be silicon nitride.

The self-aligned contact caps 44 adopt the shape of the cavities 31. As a result, each of the self-aligned contact caps 44 includes multiple sections of different widths. Each self-aligned contact cap 44 includes a lower section arranged adjacent to, and coextensive with, the top surface 30 of each gate electrode 16, 18, 20, a middle section arranged over the lower section, and an upper section arranged over the middle section. The lower section of each self-aligned contact cap 44 has a width dimension may be substantially equal or equal to the width dimension, W1. The lower section of each self-aligned contact cap 44 is arranged laterally in its entirety between portions of the nearest-neighbor sidewall spacers 42, and may extend from one of the sidewall spacers 42 to the other of the sidewall spacers 42 and may directly contact the sidewall spacers 42. The lower section of each self-aligned contact cap 44 may be in direct contact with the top surface 30 of each gate electrode 16, 18, 20. The middle section of each self-aligned contact cap 44 has a width dimension may be substantially equal or equal to the width dimension, W2. The middle section of each self-aligned contact cap 44 is arranged laterally in its entirety between portions of the nearest-neighbor sidewall spacers 32, and may extend from one of the sidewall spacers 32 to the other of the sidewall spacers 32 and directly contact the sidewall spacers 32. The upper section of each self-aligned contact cap 44 has a width dimension may be substantially equal or equal to the width dimension, W3. The upper section of each self-aligned contact cap 44 is arranged laterally in its entirety between the nearest-neighbor sections of the interlayer dielectric layer 36, and may extend from one of the sections of the interlayer dielectric layer 36 to the other of the sections of the interlayer dielectric layer 36 and may directly contact the sections of the interlayer dielectric layer 36.

The sidewall spacers 42 replace respective portions of each self-aligned contact cap 44. The partial replacement of the dielectric material with a comparatively-high permittivity in the self-aligned contact cap 44 with a dielectric material with a comparatively-low permittivity in the sidewall spacers 42 may contribute to reducing the effective parasitic capacitance of the structure.

Figure 8:
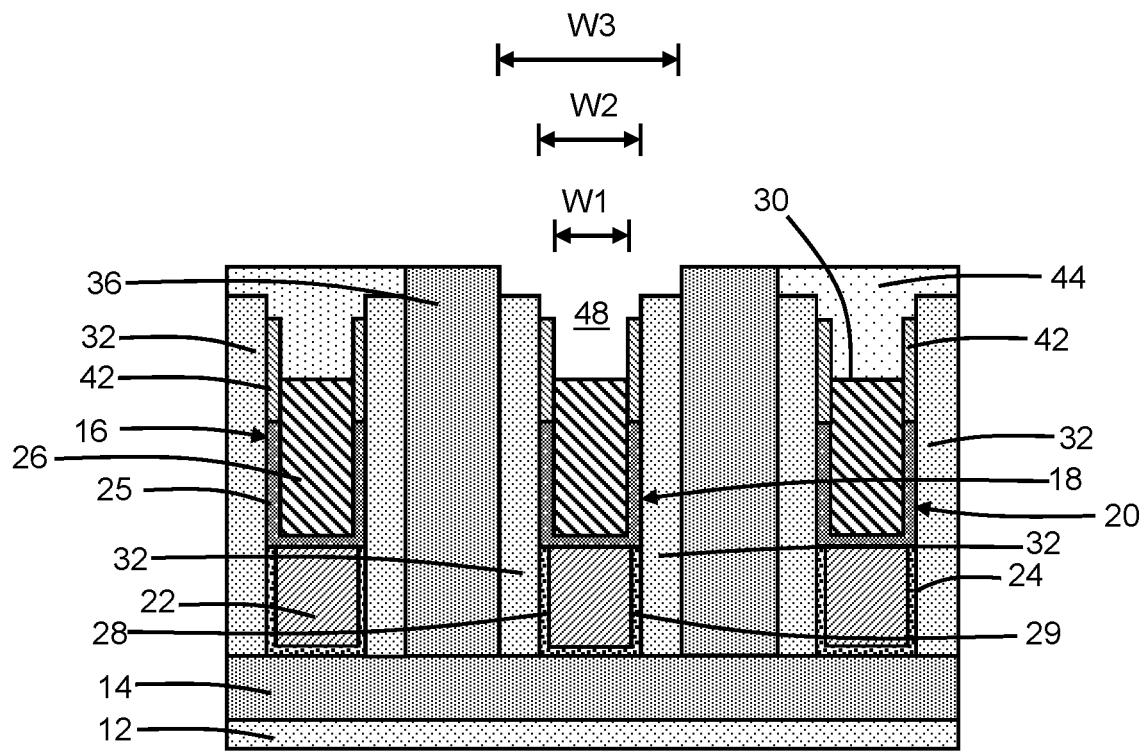
Figure 8A:
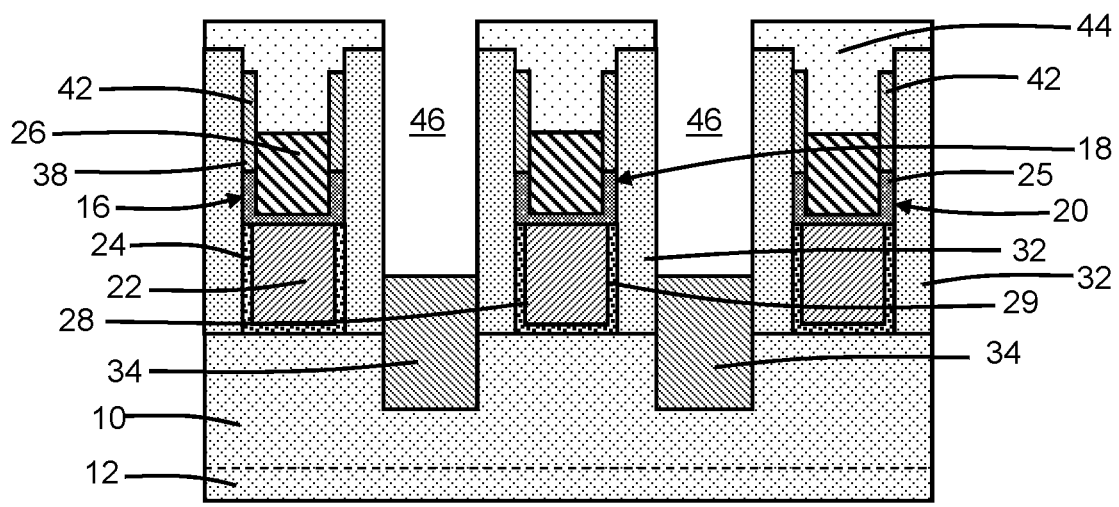

With reference to FIGS. 8 and 8A in which like reference numerals refer to like features in FIGS. 7 and 7A and at a subsequent fabrication stage of the processing method, openings 46 are formed that extend in a vertical direction to the epitaxial semiconductor layers 34 by applying an etch mask and removing unmasked portions of the sections of the interlayer dielectric layer 36 arranged over the fin 10 with an etching process, such as a reactive ion etching process. The etch mask may include an organic planarization layer (OPL) material and an anti-reflection coating in the lithography stack that are patterned with lithography and etching processes. The unmasked portions of the sections of the interlayer dielectric layer 36 may be removed selective to the material of the self-aligned contact caps 44 and is thereby self-aligned by the self-aligned contact caps 44. The openings 46 reveal the semiconductor layers 34 for the subsequent formation of source/drain contacts, and the etch mask is removed after forming the openings.

An opening 48 is formed that extends to a section of the gate electrode 18 over the trench isolation region 14 by applying another etch mask and removing a section of the self-aligned contact cap 44. The etch mask may include an organic planarization layer (OPL) material and an anti-reflection coating in the lithography stack that are patterned with lithography and etching processes. Portions of the etch mask used to form the opening 48 fill the previously-formed openings 46 over the semiconductor layers 34. The section of the self-aligned contact cap 44 is removed by an etching process, such as a reactive ion etching process, and the etch mask is removed after its removal. The etching process removes the dielectric material of the self-aligned contact cap 44 selective to the dielectric materials of the sidewall spacers 32 and the interlayer dielectric layer 36.

The sidewall spacers 42 line a portion of the opening 48 and cover respective portions of the sidewall spacers 32. The sidewall spacers 42 are arranged as inner spacers inside the opening 48 interior of the sidewall spacers 32, which represent outer spacers. Inside the opening 48, the sidewall spacers 32 are taller than the sidewall spacers 42 relative to the top surface 30 of the gate electrode 18.

The opening 48 has multiple widths and represents a re-opened portion of the one of the multiple-width cavities 31. The lower section of the opening 48 has a width dimension may be substantially equal or equal to the width dimension, W1, and the lower section of the opening 48 is arranged laterally in its entirety between the nearest-neighbor sidewall spacers 42. The middle section of the opening 48 has a width dimension may be substantially equal or equal to the width dimension, W2, and the middle section of the opening 48 is arranged laterally in its entirety between the nearest-neighbor sidewall spacers 32. The upper section of the opening 48 has a width dimension may be substantially equal or equal to the width dimension, W3, and the upper section of the opening 48 is arranged laterally in its entirety between the nearest-neighbor sections of the interlayer dielectric layer 36.

Figure 9:
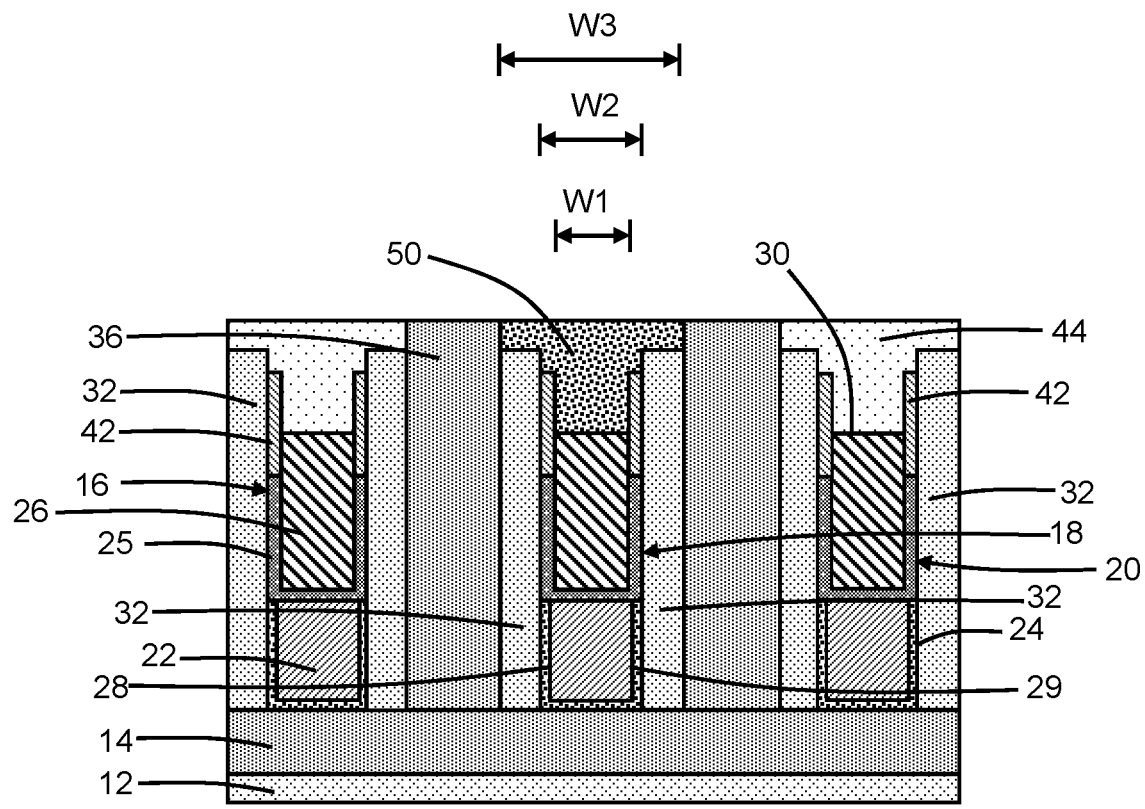
Figure 9A:
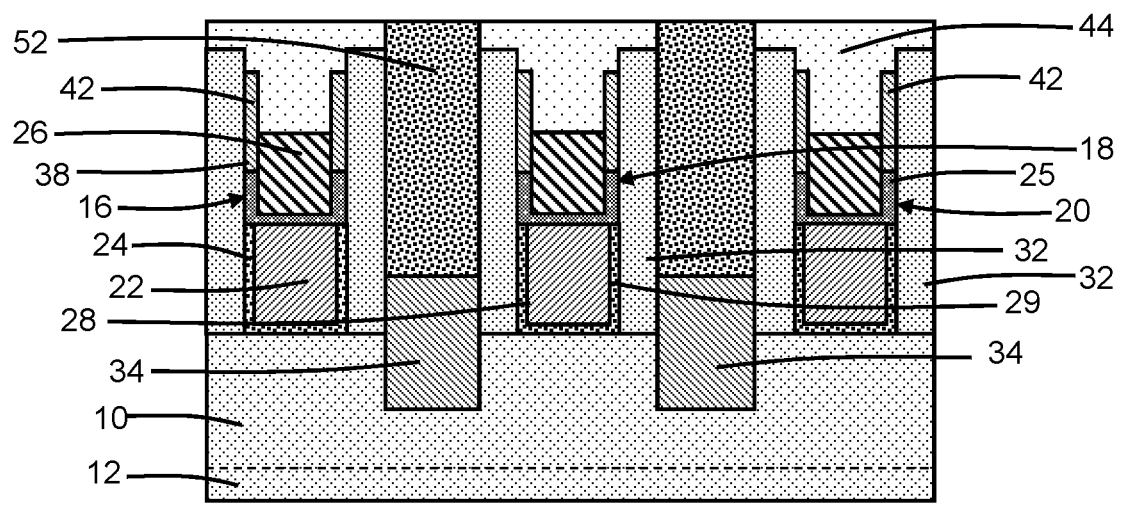

With reference to FIGS. 9 and 9A in which like reference numerals refer to like features in FIGS. 8 and 8A and at a subsequent fabrication stage of the processing method, a gate contact 50 may be formed in the opening 48 over the section of the gate electrode 18 exposed by the removal of the section of the self-aligned contact cap 44. The gate contact 50 may contain a metal (e.g., tungsten) deposited by chemical vapor deposition or atomic layer deposition and then planarized by a chemical-mechanical planarization process. Source/drain contacts 52 may be formed in the openings 46 over the semiconductor layers 34. The source/drain contacts 52 may contain a metal silicide and a metal fill (e.g., tungsten) deposited by chemical vapor deposition or atomic layer deposition and then planarized by a chemical-mechanical planarization process.

The gate contact 50 conforms to the shape of the opening 48 and inherits the multiple widths of the opening 48. A lower section of the gate contact 50 has a width dimension that may be substantially equal or equal to the width dimension, W1. The lower section of the opening 48 is arranged laterally in its entirety between the nearest-neighbor sidewall spacers 42, and may be in direct contact with the sidewall spacers 42. A middle section of the gate contact 50 has a width dimension that may be substantially equal or equal to the width dimension, W2. The middle section of the gate contact 50 is arranged laterally in its entirety between the nearest-neighbor sidewall spacers 32, and may be in direct contact with the sidewall spacers 32. An upper section of the gate contact 50 has a width dimension that may be substantially equal or equal to the width dimension, W3. The upper section of the gate contact 50 is arranged laterally in its entirety between the nearest-neighbor sections of the interlayer dielectric layer 36, and may directly contact the sections of the interlayer dielectric layer 36.

The gate contact 50 is coupled with a section of the gate electrode 18 that is arranged over the trench isolation region 14. The source/drain contacts 52 are arranged over the fin 10 and the epitaxial semiconductor layers 34 adjacent to a different section of the gate electrode 18, and the source/drain contacts 52 are displaced along the length (i.e., the longitudinal axis 17 (FIG. 1)) of the gate electrode 18 from the gate contact 50. The lateral arrangement of the sidewall spacers 32 and sidewall spacers 42 between the gate electrode 18 and the source/drain contacts 52 may reduce the likelihood of shorting between the gate electrode 18 and the nearby source/drain contacts 52.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly" on or in "direct contact" with another feature if intervening features are absent. A feature may be "indirectly" on or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a first outer sidewall spacer;
    a first inner sidewall spacer, the first inner sidewall spacer comprised of a low-k dielectric material;
    a gate electrode arranged adjacent to the first outer sidewall spacer and the first inner sidewall spacer, the gate electrode having a top surface that is recessed relative to the first outer sidewall spacer and the first inner sidewall spacer; and
    a gate cap having a first section of a first width arranged over the top surface of the gate electrode and a second section of a second width arranged over the first section of the gate cap and the first inner sidewall spacer, the second width greater than the first width,
    wherein the first inner sidewall spacer and the first outer sidewall spacer each project above the top surface of the gate electrode, and the first inner sidewall spacer projects by a lesser amount above the top surface of the gate electrode than the first outer sidewall spacer.

2. The structure of claim 1 wherein the low-k dielectric material of the first inner sidewall spacer has a permittivity that is less than 3.9.

3. The structure of claim 2 wherein the gate cap is comprised of a dielectric material having a permittivity that is greater than 3.9.

4. The structure of claim 3 wherein the dielectric material of the gate cap is silicon nitride.

5. The structure of claim 1 wherein the gate cap includes a third section of a third width arranged over the first section of the gate cap, the first inner sidewall spacer, and the first outer sidewall spacer, and the third width is greater than the second width.

6. The structure of claim 1 further comprising:
a second outer sidewall spacer; and
a second inner sidewall spacer,
wherein the first section of the gate cap is laterally arranged between the first outer sidewall spacer and the second outer sidewall spacer, and the second section of the gate cap is laterally arranged between the first inner sidewall spacer and the second inner sidewall spacer.

7. The structure of claim 1 further comprising:
a source/drain region; and
a contact extending adjacent to the first outer sidewall spacer to the source/drain region,
wherein the first outer sidewall spacer and the first inner sidewall spacer are laterally arranged between the contact and the gate electrode.

8. The structure of claim 7 further comprising:
a semiconductor fin,
wherein the source/drain region is arranged at least in part in the semiconductor fin, and the gate electrode has an overlapping arrangement with the semiconductor fin.

9. The structure of claim 1 wherein the first inner sidewall spacer includes a lower portion arranged below the top surface of the gate electrode and an upper portion that projects above the top surface of the gate electrode.

10. A structure comprising:
a first outer sidewall spacer;
a first inner sidewall spacer, the first inner sidewall spacer comprised of a low-k dielectric material;
a gate electrode arranged adjacent to the first outer sidewall spacer and the first inner sidewall spacer, the gate electrode having a top surface that is recessed relative to the first outer sidewall spacer and the first inner sidewall spacer;
a gate cap having a first section of a first width arranged over the top surface of the gate electrode, a second section of a second width arranged over the first section of the gate cap and the first inner sidewall spacer, a third section of a third width arranged over the first section of the gate cap, the first inner sidewall spacer, and the first outer sidewall spacer, and an opening extending through the gate cap to the gate electrode, the second width greater than the first width, and the third width greater than the second width; and
a gate contact arranged in the opening, the gate contact having a first section arranged over the top surface of the gate electrode and a second section arranged over the first section of the gate cap and the first inner sidewall spacer, the first section of the gate contact having a first width substantially equal to the first width of the first section of the gate cap, and the second section of the gate contact having a second width substantially equal to the second width of the second section of the gate cap,
wherein the gate contact includes a third section arranged over the first section of the gate contact, the first inner sidewall spacer, and the first outer sidewall spacer, and the third section of the gate contact has a third width substantially equal to the third width of the third section of the gate cap.

11. The structure of claim 10 further comprising:
a trench isolation region,
wherein the gate contact and the opening in the gate cap are arranged over the trench isolation region.

12. The structure of claim 10 wherein the first inner sidewall spacer and the first outer sidewall spacer each project above the top surface of the gate electrode.

13. The structure of claim 12 wherein the first inner sidewall spacer projects by a lesser amount above the top surface of the gate electrode than the first outer sidewall spacer.

14. The structure of claim 10 further comprising:
a source/drain region; and
a contact extending adjacent to the first outer sidewall spacer to the source/drain region,
wherein the first outer sidewall spacer and the first inner sidewall spacer are laterally arranged between the contact and the gate electrode.

15. The structure of claim 14 further comprising:
a semiconductor fin,
wherein the source/drain region is arranged at least in part in the semiconductor fin, and the gate electrode has an overlapping arrangement with the semiconductor fin.

16. The structure of claim 10 further comprising:
a second outer sidewall spacer; and
a second inner sidewall spacer,
wherein the first section of the gate cap is laterally arranged between the first outer sidewall spacer and the second outer sidewall spacer, and the second section of the gate cap is laterally arranged between the first inner sidewall spacer and the second inner sidewall spacer.

17. The structure of claim 10 wherein the low-k dielectric material of the first inner sidewall spacer has a permittivity that is less than 3.9.

18. The structure of claim 17 wherein the gate cap is comprised of a dielectric material having a permittivity that is greater than 3.9.

19. The structure of claim 18 wherein the dielectric material of the gate cap is silicon nitride.

* * * * *